United States Patent
Ding et al.

(10) Patent No.: US 12,356,784 B2
(45) Date of Patent: Jul. 8, 2025

(54) STACKED CELL AND PREPARATION METHOD THEREOF

(71) Applicant: TRINA SOLAR CO., LTD., Changzhou (CN)

(72) Inventors: Xiaobing Ding, Changzhou (CN); Guangtao Yang, Changzhou (CN); Rui Xia, Changzhou (CN); Yiqi Chen, Changzhou (CN); Xueling Zhang, Changzhou (CN); Daming Chen, Changzhou (CN)

(73) Assignee: TRINA SOLAR CO., LTD., Changzhou (CN)

(*) Notice: Subject to any disclaimer, the term of this patent is extended or adjusted under 35 U.S.C. 154(b) by 0 days.

(21) Appl. No.: 18/768,878

(22) Filed: Jul. 10, 2024

(65) Prior Publication Data

US 2024/0373659 A1 Nov. 7, 2024

(30) Foreign Application Priority Data

Nov. 15, 2023 (CN) .......................... 202311518066.5

(51) Int. Cl.
*H10K 39/12* (2023.01)
*H10K 39/15* (2023.01)

(52) U.S. Cl.
CPC ............. *H10K 39/12* (2023.02); *H10K 39/15* (2023.02)

(58) Field of Classification Search
CPC ................................ H10K 39/12; H10K 39/15
See application file for complete search history.

(56) References Cited

U.S. PATENT DOCUMENTS

| | | | |
|---|---|---|---|
| 2008/0190479 A1 | 8/2008 | Hsieh et al. | |
| 2010/0089449 A1* | 4/2010 | Ahn | H01L 31/0725 136/258 |
| 2016/0190377 A1* | 6/2016 | Green | H01L 31/18 438/74 |
| 2019/0198684 A1* | 6/2019 | Wheeler | H01L 31/048 |
| 2024/0341107 A1* | 10/2024 | Wu | H10K 30/87 |

FOREIGN PATENT DOCUMENTS

| | | | |
|---|---|---|---|
| CN | 109860221 A | 6/2019 | |
| CN | 110649111 A | 1/2020 | |
| CN | 212323018 U * | 1/2021 | ....... H01L 31/02167 |
| CN | 112 687 766 A | 4/2021 | |

(Continued)

OTHER PUBLICATIONS

Zhao et al., CN 212323018 U, English Machine Translation. (Year: 2021).*

(Continued)

*Primary Examiner* — Tae-Sik Kang
(74) *Attorney, Agent, or Firm* — MARSHALL, GERSTEIN & BORUN LLP

(57) ABSTRACT

A stacked cell and preparation method thereof. The stacked cell includes: a crystalline silicon cell; a conductive connecting layer located on a surface of the crystalline silicon cell; a first isolation layer extending from a surface of the conductive connecting layer facing away from the crystalline silicon cell to penetrate through the conductive connecting layer, and a perovskite cell located on the surface of the conductive connecting layer facing away from the crystalline silicon cell.

20 Claims, 4 Drawing Sheets

(56) References Cited

FOREIGN PATENT DOCUMENTS

| | | |
|---|---|---|
| CN | 113 328 010 A | 8/2021 |
| CN | 114256387 A | 3/2022 |
| CN | 114927622 A | 8/2022 |
| CN | 115768145 A | 3/2023 |
| CN | 115996617 A | 4/2023 |
| CN | 219019438 U | 5/2023 |
| JP | 2015 198142 A | 11/2015 |
| KR | 2019 0053374 A | 5/2019 |
| WO | WO-2019/048839 A1 | 3/2019 |
| WO | WO-2022/023182 A1 | 2/2022 |
| WO | WO-2022/102128 A1 | 5/2022 |
| WO | WO-2022/127669 A1 | 6/2022 |
| WO | WO-2022/255804 A1 | 12/2022 |
| WO | WO-2023029613 A1 * | 3/2023 ......... H01L 31/0549 |

OTHER PUBLICATIONS

Bush et al., "Compositional Engineering for Efficient Wide Band Gap Perovskites with Improved Stability to Photoinduced Phase Segregation", ACS Energy Lett. 2018, 3, 428-435. (Year: 2018).*
Chinese Office Action, Chinese Patent Application No. 202311518066.5, dated Dec. 27, 2023.
Decision of Grant, Chinese Patent Application No. 202311518066.5, dated Jan. 23, 2024.
Japanese Office Action, Japanese Patent Application No. 2024-106327, dated Jul. 24, 2024.
European Search Report, European Patent Application No. 24182031.5, Jan. 27, 2025.

* cited by examiner

STACKED CELL AND PREPARATION METHOD THEREOF

CROSS-REFERENCE TO RELATED APPLICATIONS

This application claims priority to Chinese patent application No. 202311518066.5, filed on Nov. 15, 2023, the content of which is hereby incorporated by reference in its entirety.

TECHNICAL FIELD

The present disclosure relates to the technical field of solar cells and, in particular, to a stacked cell and a preparation method thereof.

BACKGROUND

Perovskite solar cells have become the most promising solar cells and a research hotspot due to their outstanding advantages such as high photoelectric conversion efficiency, low cost and simple production. The perovskite absorption layer with a wide bandgap and the crystalline silicon solar cell with a silicon heterojunction (SHJ) form a double-junction solar cell, which can improve the photoelectric conversion efficiency of solar cells.

In a typical perovskite/crystalline silicon stacked cell, the perovskite cell and the crystalline silicon cell are connected in series via a conductive intermediate layer interposed therebetween. How to improve the performance of the stacked cell has become an urgent problem to be solved.

SUMMARY

The embodiments of the present disclosure provide a silicon stacked cell, which can optimize the longitudinal transport capability of carriers in the stacked cell and improve the performance of the stacked cell.

A stacked cell is provided, including:
a crystalline silicon cell;
a conductive connecting layer located on a surface of the crystalline silicon cell;
a first isolation layer extending from a surface of the conductive connecting layer facing away from the crystalline silicon cell to penetrate through the conductive connecting layer; and
a perovskite cell located on the surface of the conductive connecting layer facing away from the crystalline silicon cell.

In an embodiment, the conductive connecting layer includes a main connecting layer and a peripheral connecting layer, and in a plane parallel to the crystalline silicon cell, the peripheral connecting layer at least partially surrounds the main connecting layer, and the first isolation layer is located in at least a partial region between the peripheral connecting layer and the main connecting layer.

In an embodiment, the crystalline silicon cell includes:
a substrate having a first conductivity type;
a first doped layer located on a side of the substrate facing away from the conductive connecting layer, and having a second conductivity type;
a bottom transparent conductive layer located on a surface of the first doped layer facing away from the substrate; and
a second isolation layer extending from a surface of the bottom transparent conductive layer facing away from the first doped layer to penetrate through the bottom transparent conductive layer.

In an embodiment, the bottom transparent conductive layer includes a main conductive layer and an auxiliary conductive layer, and in a plane parallel to the crystalline silicon cell, the auxiliary conductive layer at least partially surrounds the main conductive layer, and the second isolation layer is located in at least a partial region between the auxiliary conductive layer and the main conductive layer.

In an embodiment, an orthographic projection of the first isolation layer on the bottom transparent conductive layer covers the second isolation layer.

In an embodiment, the crystalline silicon cell further includes:
a first electrode layer located on a surface of the bottom transparent conductive layer facing away from the first doped layer; and
an anti-reflection layer located on a part of a surface of the first electrode layer facing away from the bottom transparent conductive layer.

In an embodiment, the crystalline silicon cell further includes:
a first passivation layer located between the first doped layer and the substrate;
a second passivation layer located on a surface of the substrate facing away from the first doped layer; and
a second doped layer located on a surface of the second passivation layer facing away from the substrate and in contact with the conductive connecting layer, and having the first conductivity type.

In the above stacked cell, the conductive connecting layer connecting the crystalline silicon cell and the perovskite cell is provided with a first isolation layer. Since the first isolation layer that extends from a surface of the conductive connecting layer facing away from the crystalline silicon cell to penetrate through the conductive connecting layer barriers the transport of the carriers in the conductive connecting layer between the two opposite sidewalls of the first isolation layer, the transport capability of carriers in a direction of the connection between the crystalline silicon cell and the perovskite cell is improved, thereby reducing the leakage in the perovskite cell, increasing the voltage of the silicon stacked cell and improving the performance of the stacked cell.

The present disclosure further provides a preparation method of a stacked cell, the preparation method includes:
providing a crystalline silicon cell;
forming a conductive connecting layer on a surface of the crystalline silicon cell;
forming a first isolation layer in the conductive connecting layer, the first isolation layer extending from a surface of the conductive connecting layer facing away from the crystalline silicon cell to penetrate through the conductive connecting layer; and
forming a perovskite cell on a surface of the conductive connecting layer facing away from the crystalline silicon cell.

In an embodiment, the conductive connecting layer includes a main connecting layer and a peripheral connecting layer, and in a plane parallel to the crystalline silicon cell, the peripheral connecting layer at least partially surrounded the main connecting layer, and forming the first isolation layer in the conductive connecting layer includes:
forming, in the conductive connecting layer, a first annular groove penetrating through the conductive connecting layer, the first annular groove being located in at least a partial region between the main connecting layer and the peripheral connecting layer; and filling the first annular groove to form the first isolation layer.

In an embodiment, providing the crystalline silicon cell includes:

providing a substrate having a first conductivity type;

forming a first doped layer having a second conductivity type on a side of the substrate facing away from the conductive connecting layer;

forming a bottom transparent conductive layer on a surface of the first doped layer facing away from the substrate; and forming a second isolation layer in the bottom transparent conductive layer, the second isolation layer extending from a surface of the bottom transparent conductive layer facing away from the first doped layer to penetrate through the bottom transparent conductive layer.

In an embodiment, the bottom transparent conductive layer includes a main conductive layer and an auxiliary conductive layer, and in a plane parallel to the crystalline silicon cell, the auxiliary conductive layer at least partially surrounded the main conductive layer, and forming the second isolation layer in the bottom transparent conductive layer includes:

forming the second isolation layer in the bottom transparent conductive layer, the second isolation layer being located in at least a partial region between the auxiliary conductive layer and the main conductive layer.

In an embodiment, providing the crystalline silicon cell further includes:

forming a first electrode layer on a surface of the bottom transparent conductive layer facing away from the first doped layer; and forming an anti-reflection layer on a part of a surface of the first electrode layer facing away from the bottom transparent conductive layer.

In an embodiment, before forming the first doped layer having the second conductivity type on the side of the substrate facing away from the conductive connecting layer, the preparation method further includes:

forming a first passivation layer on a surface of the substrate facing away from the conductive connecting layer;

forming a second passivation layer on a surface of the substrate close to the conductive connecting layer; and forming a second doped layer having the first conductivity type on a surface of the second passivation layer, the second doped layer being in contact with the conductive connecting layer.

In an embodiment, after providing the substrate having the first conductivity type, the preparation method further includes:

preprocessing the substrate to obtain a preset substrate; and where the preset substrate includes one of a double-sided polished substrate, a double-sided textured substrate, and a single-sided polished and single-sided textured substrate.

In the above preparation method of a stacked cell, a first isolation layer is formed in the conductive connecting layer connecting the crystalline silicon cell and the perovskite cell. Since the first isolation layer that extends from a surface of the conductive connecting layer facing away from the crystalline silicon cell to penetrate through the conductive connecting layer barriers the transport of the carriers in the conductive connecting layer between the two opposite sidewalls of the first isolation layer, the transport capability of carriers in a direction of the connection between the crystalline silicon cell and the perovskite cell is improved, thereby reducing the leakage in the perovskite cell, increasing the voltage of the silicon stacked cell and improving the performance of the stacked cell.

BRIEF DESCRIPTION OF THE DRAWINGS

In order to describe the technical solutions of the embodiments of the present disclosure or the conventional art more clearly, the accompanying drawings required for describing the embodiments or for describing the conventional art will be briefly introduced as follows. Apparently, the accompanying drawings, in the following description, illustrate merely some embodiments of the present disclosure, for a person of ordinary skill in the art, other drawings can also be obtained according to these accompanying drawings without making any creative efforts.

Figure 1:
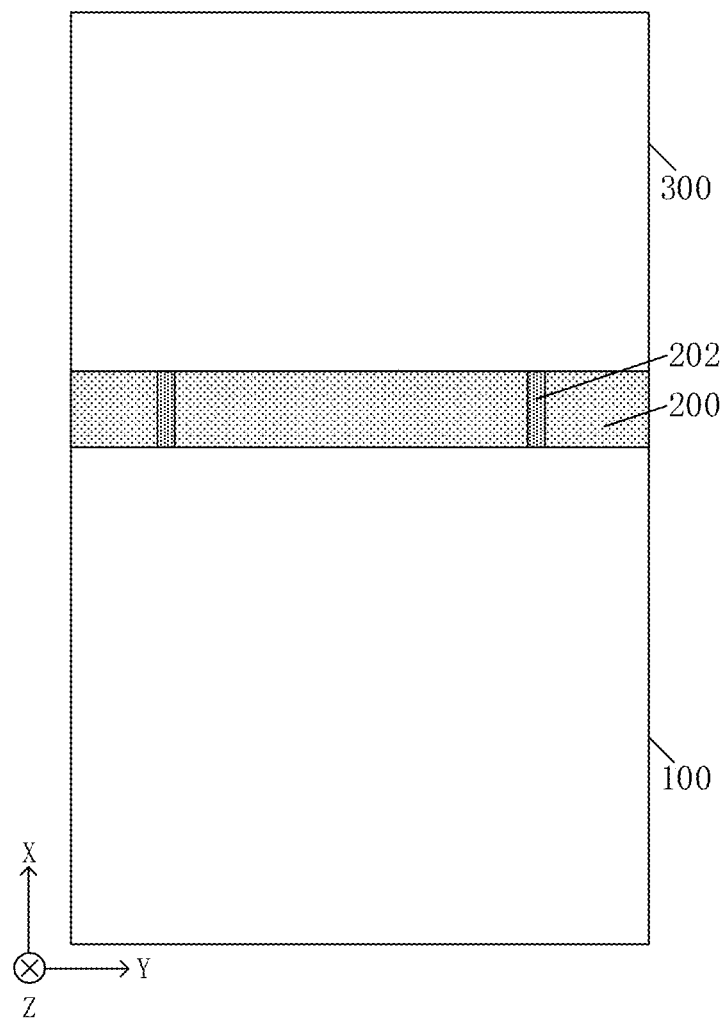
FIG. 1 is a schematic diagram showing a cross-section of a stacked cell in an embodiment.

DESCRIPTION OF DRAWING REFERENCE SIGNS 100, crystalline silicon cell; 102, substrate; 104, first doped layer; 106, bottom transparent conductive layer; 108, second isolation layer; 110, first passivation layer; 112, second passivation layer; 114, second doped layer; 116, first electrode layer; 118, anti-reflection layer; 200, conductive connecting layer; 202, first isolation layer; 204, main connecting layer; 206, peripheral connecting layer; 208, main conductive layer; 210, auxiliary conductive layer; 300, perovskite cell; 302, first carrier transport layer; 304, perovskite layer; 306, second carrier transport layer; 308, top transparent conductive layer; 310, second electrode layer.

DETAILED DESCRIPTION OF THE EMBODIMENTS

In order to facilitate understanding of the embodiments of the present disclosure, the embodiments of the present disclosure will be described more fully below with reference to the relevant accompanying drawings. Preferred embodiments of the embodiments of the present disclosure are presented in the accompanying drawings. However, the embodiments of the present disclosure may be implemented in many different forms and are not limited to the embodiments described herein. Rather, these embodiments are provided for the purpose of making the present disclosure more thorough and comprehensive.

Unless otherwise defined, all technical and scientific terms used herein have the same meaning as commonly understood by those skilled in the technical field to which the embodiments of the present disclosure belong. The terms used herein in the specification of the embodiments of the present disclosure are for the purpose of describing specific embodiments only, and are not intended to limit the embodiments of the present disclosure. The term "and/or" as used herein includes any and all combinations of one or more of the relevant listed items.

In the description of the embodiments of the present disclosure, it should be understood that the orientation or position relationship indicated by the terms "upper", "lower", "vertical", "horizontal", "inner", "outer", etc. are based on the orientation or position relationship shown in the accompanying drawings and are merely intended to facilitate the description of the embodiments of the present disclosure and simplify the description, rather than indicating or implying that the indicated device or element must have a particular orientation or be constructed and operated in a particular orientation, and therefore are not to be interpreted as limiting the embodiments of the present disclosure.

It will be understood that the terms "first", "second", etc. used in this disclosure may be used herein to describe various elements, but these elements are not limited by these terms. These terms are only used to distinguish the first element from another element. For example, without departing from the scope of the present disclosure, the first isolation layer may be referred to as a second isolation layer, and similarly, the second isolation layer may be referred to as a first isolation layer. Both the first isolation layer and the second isolation layer are isolation layers, but they are not the same isolation layer.

In addition, the terms "first" and "second" are used for descriptive purposes only, and cannot be interpreted as indicating or implying relative importance or implicitly specifying the quantity of indicated technical features. Thus, the features defined as "first" and "second" may explicitly or implicitly include at least one of these features. In the description of the present disclosure, "plurality" means at least two, such as two, three, etc., unless otherwise clearly and specifically defined. In the description of the present disclosure, "several" means at least one, e.g., one, two, etc., unless otherwise clearly and specifically defined.

FIG. 1 is a schematic diagram showing a cross-section of a stacked cell in an embodiment. The X direction is a direction from a bottom surface to a top surface of the stacked cell in FIG. 1, the Y direction is a row direction in a plane parallel to a crystalline silicon cell 100 shown in FIG. 1, and the Z direction can be a column direction in the plane parallel to the crystalline silicon cell 100 shown in FIG. 1.

As shown in FIG. 1, in present embodiment, a stacked cell is provided. The stacked cell includes a crystalline silicon cell 100, a conductive connecting layer 200, a first isolation layer 202 and a perovskite cell 300 that are sequentially stacked in the first direction X. The conductive connecting layer 200 is located on a surface of the crystalline silicon cell 100. The first isolation layer 202 extends from a surface of the conductive connecting layer 200 facing away from the crystalline silicon cell 100 to penetrate through the conductive connecting layer 200. The perovskite cell 300 is located on the surface of the conductive connecting layer 200 facing away from the crystalline silicon cell 100, and the conductive connecting layer 200 achieves the connection between the crystalline silicon cell 100 and the perovskite cell 300.

The first isolation layer 202 is made of an insulating material. Through the first isolation layer 202, the transverse (in a plane where the Y and Z directions are located) transport of carriers in the conductive connecting layer 200 on both sides of the first isolation layer 202 can be reduced, and the longitudinal (in a plane where the X direction is located) transport of the carriers can be increased, thereby improving the performance of the stacked cell.

A constituent material of the conductive connecting layer 200 includes, but is not limited to, one of ITO, ICO, IWO, VTTO, IZO, and AZO. Exemplarily, the conductive connecting layer 200 is made of a transparent material, which avoids affecting the absorption of sunlight by the perovskite layer 304. A thickness of the conductive connecting layer 200 is in a range of 15 nm to 25 nm, such as 15 nm, 20 nm, or 25 nm, etc. Alternatively, the thickness of the conductive connecting layer 200 is controlled to be in a range of 80 nm to 150 nm, such as 80 nm, 100 nm, or 150 nm, etc.

In the first direction X, the conductive connecting layer 200 includes a bottom surface in contact with the crystalline silicon cell 100, and a top surface in contact with the perovskite cell 300. In this disclosure, for exemplary descriptions, taking the conductive connecting layer 200 as a reference base, the surfaces of the layers in the crystalline silicon cell 100 and the perovskite cell 300 facing away from the conductive connecting layer 200 are as the top surfaces, and the surfaces thereof facing the conductive connecting layer 200 are as the bottom surfaces.

Figure 2:
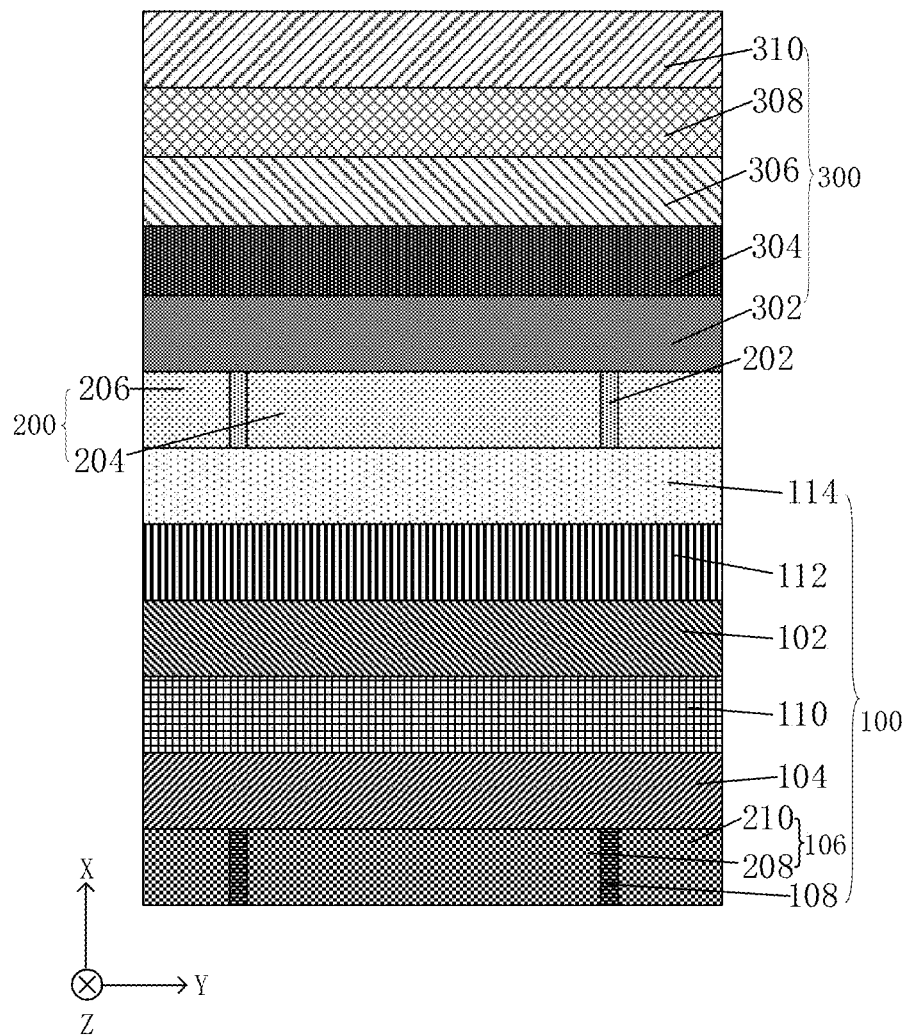
FIG. 2 is a schematic diagram showing a cross-section of a stacked cell in another embodiment.

FIG. 2 is a schematic diagram showing a cross-section of a stacked cell in another embodiment. As shown in FIG. 2, in the first direction X, the perovskite cell 300 includes a first carrier transport layer 302, a perovskite layer 304, a second carrier transport layer 306, a top transparent conductive layer 308, and a second electrode layer 310 that are sequentially stacked on the top surface of the conductive connecting layer 200. The first and second carriers are holes and electrons, respectively. After absorbing sunlight, the perovskite layer 304 generates holes and electrons. The first carrier transport layer 302 is configured to extract the first carriers from the perovskite layer 304, and transport the first carriers to the conductive connecting layer 200 and the crystalline silicon cell, thereby achieving the transmission of the electric current in the stacked cell. The second carrier transport layer 306 is configured to extract the second carriers from the perovskite layer 304, and transport the second carriers to the top transparent conductive layer 308 and the second electrode layer 310, thereby achieving the transmission of the electric current in the stacked cell. The second electrode layer 310 acts as a lead-out electrode of the stacked cell, to connect the stacked cell to an end of a load, thereby providing electrical power to the load.

Exemplarily, the first carriers are holes, and the second carriers are electrons. A constituent material of the first carrier transport layer 302 includes nickel oxide (NiOx). A thickness of the first carrier transport layer 302 can be controlled to be in a range of 15 nm to 50 nm, such as 15 nm, 20 nm, 45 nm, 50 nm, etc. By controlling the thickness of the nickel oxide, the consumption of raw materials for the first carrier transport layer 302 can be reduced while ensuring the quality of the film formation, thereby reducing the production cost, reducing the resistance value of the series resistance in the stacked cell, and improving the performance of the stacked cell. A constituent material of the second carrier transport layer 306 includes tin oxide, oxide layer or zinc oxide, and a thickness of the second carrier transport layer 306 can be controlled to be in a range of 10 nm to 200 nm. By controlling the thickness of the second carrier transport layer 306, the consumption of raw materials for the second carrier transport layer 306 can be reduced while ensuring that the bombardment on the perovskite layer 304 during the formation of the top transparent conductive layer 308 by magnetron sputtering is minimized, thereby reducing the cost of production and ensuring the efficiency of extraction of electrons.

A constituent material of the perovskite layer 304 includes $Cs_{0.25}FA_{0.75}Pb(I_{0.8}Br_{0.2})_3$. A band gap of the perovskite layer 304 is 1.68 ev, and a thickness of the perovskite layer 304 is in a range of 200 nm to 1 μm. By controlling the thickness of the perovskite layer 304, it can be ensured that photogenerated carriers are absorbed by the first carrier transport layer 302 and the second carrier transport layer 306 while sufficiently absorbing the short-wave sunlight.

A constituent material of the top transparent conductive layer 308 includes one of ITO, ICO, IWO, VTTO, IZO and AZO. A thickness of the top transparent conductive layer 308 can be controlled to be in a range of 80 nm to 150 nm, such as 80 nm, 100 nm, 150 nm, etc., which can save cost, ensure good conductivity, and ensure a good anti-reflection effect. A constituent material of the second electrode layer 310 includes metal silver.

In the above stacked cell, the conductive connecting layer 200 connecting the crystalline silicon cell 100 and the perovskite cell 300 is provided with a first isolation layer 202. Since the first isolation layer 202 that extends from a surface of the conductive connecting layer 200 facing away from the crystalline silicon cell 100 to penetrate through the conductive connecting layer 200 barriers the transport of the carriers in the conductive connecting layer 200 between the two opposite sidewalls of the first isolation layer 202, the transport capability of carriers in a direction of the connection between the crystalline silicon cell 100 and the perovskite cell 300 is improved, thereby reducing the leakage in the perovskite cell 300, increasing the voltage of the stacked cell and improving the performance of the stacked cell.

As shown in FIG. 2, in an embodiment, the conductive connecting layer 200 includes a main connecting layer 204 and a peripheral connecting layer 206. The main connecting layer 204 is a region where longitudinally transported carriers in the conductive connecting layer 200 affect the electric current in the stacked cell, and the peripheral connecting layer 206 is a region where the longitudinally transported carriers in the conductive connecting layer 200 do not affect the electric current in the stacked cell. In a plane (the plane where the Y and Z directions are located) parallel to the crystalline silicon cell 100, the peripheral connecting layer 206 at least partially surrounds the main connecting layer 204, and the first isolation layer 202 is located in at least a partial region between the peripheral connecting layer 206 and the main connecting layer 204. By changing the size of the region of the first isolation layer 202 surrounding the main connecting layer 204, a lateral movement of the carriers in the main connecting layer 204 toward the peripheral connecting layer 206 can be changed, thereby changing the longitudinal transport capability of carriers in the main connecting layer 204, so as to adjust the performance of the stacked cell.

Further, the peripheral connecting layer 206 and the main connecting layer 204 are separated by the first isolation layer 202. The first isolation layer 202 limits the transverse transport of carriers in the main connecting layer 204 to the main connecting layer 204, avoiding the transverse transport of carriers from the main connecting layer 204 to the peripheral connecting layer 206, thus increasing a longitudinal movement of the carriers in the main connecting layer 204 while the total number of the carriers remains constant, thereby maximizing the performance of the stacked cell. Exemplarily, the peripheral connecting layer 206 completely surrounds the main connecting layer 204. In this case, the first isolation layer 202 completely surrounds the main connecting layer 204.

Exemplarily, in the plane (the plane where the Y and Z directions are located) parallel to the crystalline silicon cell 100, a shape of the first isolation layer 202 includes but is not limited to polygon (such as rectangle, square), circle, ellipse, semicircle, etc. In practical applications, the shape of the first isolation layer 202 can be set according to an active region of the stacked cell.

As shown in FIG. 2, in an embodiment, in the first direction X, the crystalline silicon cell 100 includes a substrate 102, a first doped layer 104, a bottom transparent conductive layer 106 and a second isolation layer 108. The substrate 102 has a first conductivity type. The first doped layer 104 is located on a side of the substrate 102 facing away from the conductive connecting layer 200, i.e., the first doped layer 104 is located on a top surface of substrate 102, and has a second conductivity type. The bottom transparent conductive layer 106 is located on a surface of the first doped layer 104 facing away from the substrate 102, i.e., the bottom transparent conductive layer 106 is located on a top surface of the first doped layer 104. A PN junction is formed between the substrate 102 having the first conductivity type and the first doped layer 104 having the second conductivity type. The second isolation layer 108 extends from a surface of the bottom transparent conductive layer 106 facing away from the first doped layer 104 to penetrate through the bottom transparent conductive layer 106.

The majority carriers in the substrate 102 having the first conductivity type are the second carriers, and the majority carriers in the first doped layer 104 having the second conductivity type are the first carriers. In other words, when the substrate is N-type substrate, the first carrier transport layer 302 is a hole transport layer, the second carrier transport layer 306 is an electron transport layer, and vice versa. The second conductivity type is opposite to the first conductivity type. When the first conductivity type is P-type, the second conductivity type is N-type, and when the first conductivity type is N-type, the second conductivity type is P-type. In this embodiment, the first conductivity type is P-type, and the second conductivity type is N-type.

The second isolation layer 108 is made of an insulating material. The majority carriers (the first carriers) in the bottom transparent conductive layer 106 can be effectively obtained by the second isolation layer 108, thereby improving the performance of the stacked cell.

Exemplarily, a constituent material of the substrate 102 includes monocrystalline silicon having the first conductivity type. A thickness of the substrate 102 is in a range of 50 μm to 500 μm, such as 50 μm, 100 μm, 150 μm, 300 μm, 500 μm, etc. By adjusting the thickness of the substrate 102, enough sunlight can be absorbed by the cell, while the utilization of the raw materials can be improved.

Exemplarily, a constituent material of the first doped layer 104 includes doped amorphous silicon having the second conductivity type. By adjusting the thickness of the substrate 102, a sufficient extraction efficiency of the first carriers can be achieved while avoiding excessive parasitic absorption.

Exemplarily, a thickness of the bottom transparent conductive layer 106 is 110 nm. A constituent material of the bottom transparent conductive layer 106 includes, but is not limited to one of ITO, ICO, IWO, VTTO, IZO and AZO. The conductive connecting layer 200 is made of a transparent material to avoid affecting the absorption of sunlight.

With reference to FIG. 2, in an embodiment, the bottom transparent conductive layer 106 includes a main conductive layer 208 and an auxiliary conductive layer 210. An orthographic projection of the main conductive layer 208 on the bottom transparent conductive layer 106 coincides with an orthographic projection of the main connecting layer 204 on the bottom transparent conductive layer 106. A region other than the main conductive layer 208 in the bottom transparent conductive layer 106 is the auxiliary conductive layer 210. In the plane parallel to the crystalline silicon cell 100, the auxiliary conductive layer 210 at least partially surrounds the main conductive layer 208, and the second isolation layer 108 is located in at least a partial region between the auxiliary conductive layer 210 and the main conductive layer 208. By changing the size of the region of the second isolation layer 108 surrounding the main conductive layer 208, a lateral movement of the majority carriers (the first carriers) in the main conductive layer 208 toward the auxiliary conductive layer 210 can be changed, thereby changing the effective collection of the majority carriers (the first carriers) in the bottom transparent conductive layer 106, so as to adjust the performance of the stacked cell.

In an embodiment, an orthographic projection of the first isolation layer 202 on the bottom transparent conductive layer 106 covers the second isolation layer 108. In this case, there is an overlapping region between the boundary of the transverse transport of the carriers in the conductive connecting layer 200 and the boundary of the effective collection of the majority carriers (the first carriers) in the bottom transparent conductive layer 106, so that the longitudinal transport of the carriers in the conductive connecting layer 200 and the effective collection of the majority carriers (the first carriers) in the bottom transparent conductive layer 106 can be improved, thereby further improving the performance of the stacked cell. Further, the orthographic projection of the first isolation layer 202 on the bottom transparent conductive layer 106 coincides with the second isolation layer 108, so that the performance of the stacked cell can be maximized.

As shown in FIG. 2, in an embodiment, the crystalline silicon cell 100 further includes: a first passivation layer 110, a second passivation layer 112, and a second doped layer 114 having the first conductivity type. The first passivation layer 110 is located between the first doped layer 104 and the substrate 102. The second passivation layer 112 is located on a surface of the substrate 102 facing away from the first doped layer 104. The defects on the surface of substrate 102 can be reduced through the first passivation layer 110 and the second passivation layer 112. The second doped layer 114 is located on a surface of the second passivation layer 112 facing away from the substrate 102, and is in contact with the conductive connecting layer 200 for transporting the second carriers having the first conductivity type.

Further, a constituent material of the first passivation layer 110 and/or a constituent material of the second passivation layer 112 includes intrinsic amorphous silicon or silicon dioxide. A thickness of the first passivation layer 110 and a thickness of the second passivation layer 112 is in a range of 1 nm to 20 nm, such as 1 nm, 20 nm, etc., which ensures sufficient passivation effect and improves the utilization of the raw materials while avoiding the problem of excessive resistance of the stacked cell. Exemplarily, the constituent materials of the first passivation layer 110 and the second passivation layer 112 are each the intrinsic amorphous silicon.

Further, a constituent material of the second doped layer 114 includes doped amorphous silicon having the first conductivity type. A thickness of the second doped layer 114 is in a range of 1 nm to 100 nm, so as to ensure sufficient extraction efficiency of the second carriers having the first conductivity type and avoid excessive parasitic absorption.

Figure 3:
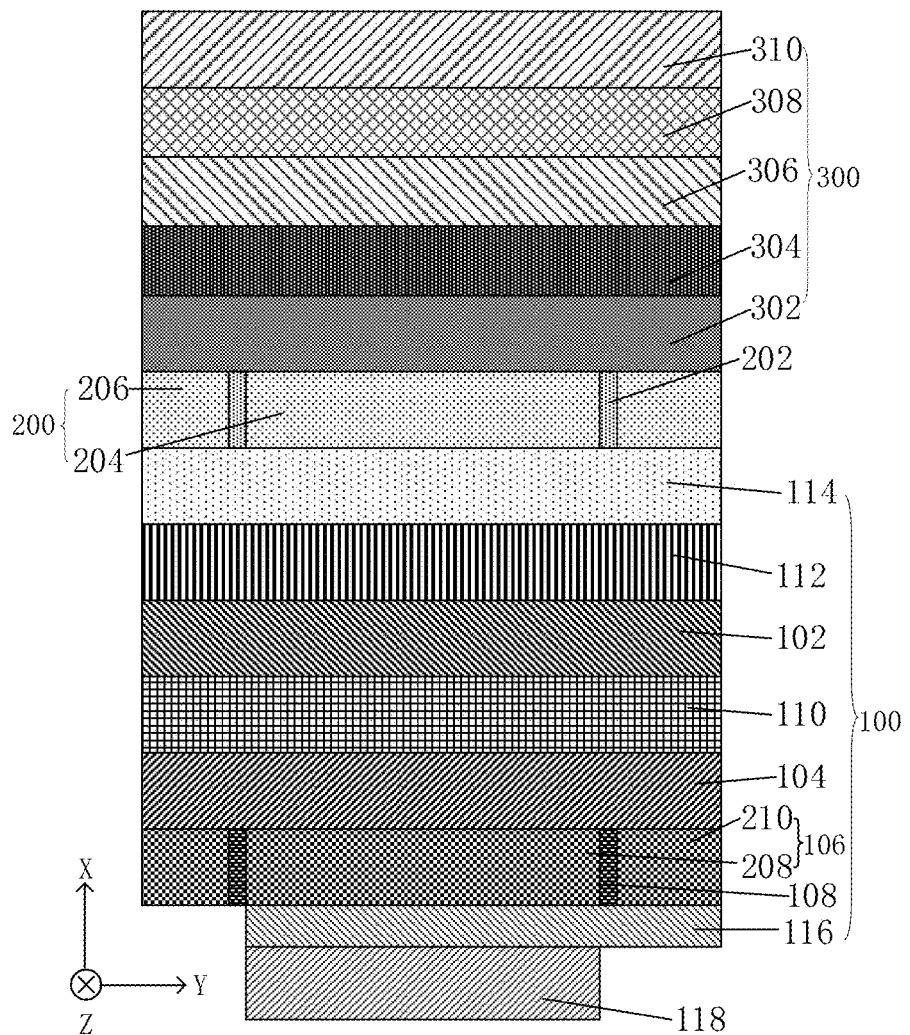
FIG. 3 is a schematic diagram showing a cross-section of a stacked cell in yet another embodiment.

FIG. 3 is a schematic diagram showing a cross-section of a stacked cell in yet another embodiment. As shown in FIG. 3, in an embodiment, the crystalline silicon cell 100 further includes: a first electrode layer 116 and an anti-reflection layer 118. The first electrode layer 116 is located on a surface of the bottom transparent conductive layer 106 facing away from the first doped layer 104, i.e., the first electrode layer 116 is located on a top surface of the bottom transparent conductive layer 106. The anti-reflection layer 118 is located on a part of a surface of the first electrode layer 116 facing away from the bottom transparent conductive layer 106, i.e., the anti-reflection layer 118 is located on a part of a top surface of the first electrode layer 116. The first electrode layer 116 that is not covered by the anti-reflection layer 118 acts as another lead-out electrode of the stacked cell to connect the stacked cell to the other end of the load, thereby providing electrical power to the load. The first electrode layer 116 acts as an electrode having the second conductivity type for the stacked cell, and the second electrode layer 310 acts as an electrode having the first conductivity type for the stacked cell. The reflection of light from the surface of the crystalline silicon cell 100 can be reduced by the anti-reflection layer 118, as well as the utilization of light can be improved, thereby further improving the electric current and fill factor of the stacked cell.

Exemplarily, an orthographic projection of the main conductive layer 208 on the anti-reflection layer 118 coincides with the anti-reflection layer 118, thus reducing the reflection of light from the surface of the crystalline silicon cell 100, while improving the utilization of the raw materials.

Exemplarily, a constituent material of the anti-reflection layer 118 includes MgF2, and a constituent material of the first electrode layer 116 includes metallic silver.

Figure 4:
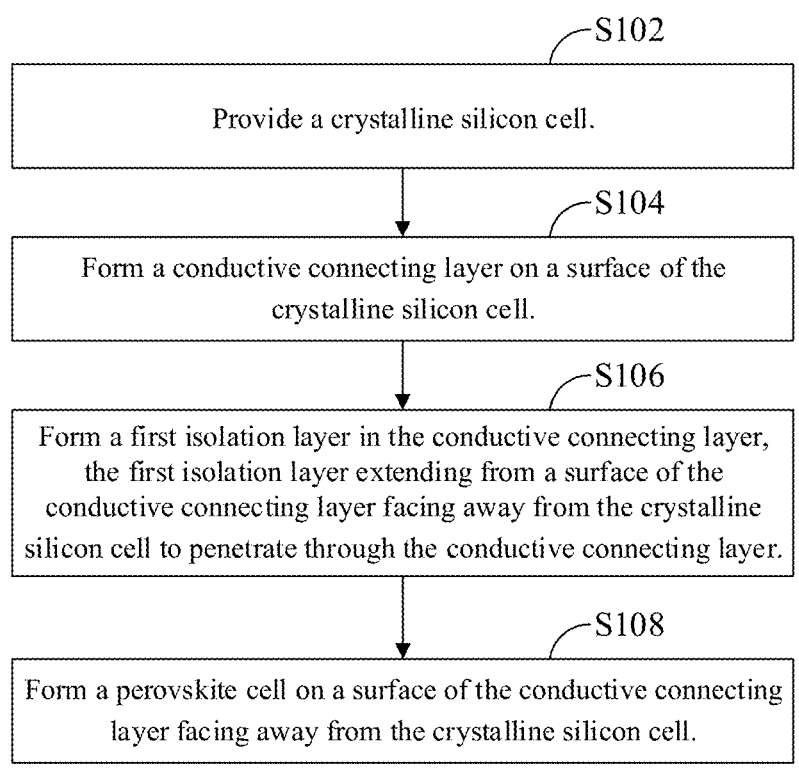
FIG. 4 is a flow chart showing a preparation method of a stacked cell in an embodiment.

The present disclosure provides a preparation method of a stacked cell, and portions that are the same as or corresponding to the above embodiments of the stacked cell will not be described again below. FIG. 4 is a flow chart showing a preparation method of a stacked cell in an embodiment. As shown in FIGS. 3 and 4, in this embodiment, a preparation method of a stacked cell is provided, the preparation method includes the following steps.

In S102, a crystalline silicon cell is provided.

In S104, a conductive connecting layer is formed on a surface of the crystalline silicon cell.

In S106, a first isolation layer is formed in the conductive connecting layer. The first isolation layer extends from a surface of the conductive connecting layer facing away from the crystalline silicon cell to penetrate through the conductive connecting layer.

In S108, a perovskite cell is formed on a surface of the conductive connecting layer facing away from the crystalline silicon cell.

In the above preparation method of a stacked cell, a first isolation layer 202 is formed in the conductive connecting layer 200 connecting the crystalline silicon cell 100 and the perovskite cell 300. Since the first isolation layer 202 that extends from a surface of the conductive connecting layer 200 facing away from the crystalline silicon cell 100 to penetrate through the conductive connecting layer 200 barriers the transport of the carriers in the conductive connecting layer 200 between the two opposite sidewalls of the first isolation layer 202, the transport capability of carriers in a direction of the connection between the crystalline silicon cell 100 and the perovskite cell 300 is improved, thereby reducing the leakage in the perovskite cell 300, increasing the voltage of the stacked cell and improving the performance of the stacked cell.

In an embodiment, the providing of the crystalline silicon cell includes steps S202 to S208.

In step S202, the substrate 102 having a first conductivity type is provided.

In an embodiment, the providing of the substrate 102 having the first conductivity type includes: processing the substrate 102 to obtain a preset substrate. The preset substrate includes one of a double-sided polished substrate, a double-sided textured substrate, and a single-sided polished and single-sided textured substrate. Specifically, after the providing of the silicon substrate 102 having the first conductivity type, at least one surface of the substrate 102 is polished and/or textured to remove a damaged layer on the surface of the substrate 102, and RCA cleaning is performed to remove impurities on the surface, so as to obtain the preset substrate. If the preset substrate has a polished surface or a micro-textured surface, the perovskite layer 304 can be prepared subsequently using a spin-coating method. If the preset substrate has a macro-textured surface, the perovskite layer 304 is prepared subsequently by a two-step method. Exemplarily, the size of the textured structure of the textured substrate 102 is in a range of 0.1 μm to 10 μm.

In step S204, a first doped layer 104 having a second conductivity type is formed on a side of the substrate 102 facing away from the conductive connecting layer 200.

In an embodiment, the forming of the first doped layer 104 having the second conductivity type on the side (in the first direction X, the side of the substrate 102 facing away from the perovskite cell 300) of the substrate 102 facing away from the conductive connecting layer 200, further includes steps S302 to S306.

In step S302, a first passivation layer 110 is formed on a surface of the substrate 102 facing away from the conductive connecting layer 200.

In step S304, a second passivation layer 112 is formed on a surface of the substrate 102 close to the conductive connecting layer 200.

In step S306, a second doped layer 114 having the first conductivity type is formed on a surface of the second passivation layer 112. The second doped layer 114 is in contact with the conductive connecting layer 200.

Specifically, using a plasma enhanced chemical vapor deposition (PECVD) process, the first passivation layer 110 is deposited on the surface of the substrate 102 facing away from the conductive connecting layer 200, and the second passivation layer 112 is deposited on the surface of the substrate 102 close to the conductive connecting layer 200, respectively. In other words, the first passivation layer 110 is formed on the bottom surface of the substrate 102, and the second passivation layer 112 is formed on the top surface of the substrate 102, respectively. Using the plasma enhanced chemical vapor deposition process, the first doped layer 104 having the second conductivity type is deposited on the top surface of the first passivation layer 110, and the second doped layer 114 having the first conductivity type is deposited on the top surface of the second passivation layer 112. Further, using a physical vapor deposition (PVD) or reactive pulsed deposition (RPD) process, the conductive connecting layer 200 is deposited on the top surface of the second doped layer 114.

In step S206, a bottom transparent conductive layer 106 is formed on a surface of the first doped layer 104 facing away from the substrate 102.

The bottom transparent conductive layer 106 is deposited on the surface of the first doped layer 104 by using the PVD or RPD process.

In step S208, a second isolation layer 108 is formed in the bottom transparent conductive layer 106. The second isolation layer 108 extends from a surface of the bottom transparent conductive layer 106 facing away from the first doped layer 104 to penetrate through the bottom transparent conductive layer 106.

In an embodiment, the bottom transparent conductive layer 106 includes a main conductive layer 208 and an auxiliary conductive layer 210. In the plane parallel to the crystalline silicon cell 100, the auxiliary conductive layer 210 at least partially surrounds the main conductive layer 208. The forming of the second isolation layer 108 in the bottom transparent conductive layer 106 includes: forming the second isolation layer 108 in the bottom transparent conductive layer 106, the second isolation layer 108 being located in at least a partial region between the auxiliary conductive layer 210 and the main conductive layer 208.

In an embodiment, the conductive connecting layer 200 includes a main connecting layer 204 and a peripheral connecting layer 206. In the plane parallel to the crystalline silicon cell 100, the peripheral connecting layer 206 at least partially surrounds the main connecting layer 204. The forming of the first isolation layer 202 in the conductive connecting layer 200 includes steps S402 to S404.

In step S402, a first annular groove penetrating through the conductive connecting layer 200 is formed in the conductive connecting layer 200. The first annular groove is located in at least a partial region between the main connecting layer 204 and the peripheral connecting layer 206.

In step S404, the first annular groove is filled to form the first isolation layer 202.

Specifically, the first annular groove penetrating through the conductive connecting layer 200 is formed in the conductive connecting layer 200 by a laser, to limit the transverse transport of the carriers between the main connecting layer 204 and the peripheral connecting layer 206, thereby improving the longitudinal transport of the carriers in the main connecting layer 204. Then the first annular groove is filled to form the first isolation layer 202.

In an embodiment, the providing of the crystalline silicon cell 100 further includes: forming a first electrode layer 116 on a surface of the bottom transparent conductive layer 106 facing away from the first doped layer 104; and forming an anti-reflection layer 118 on a part of a surface of the first electrode layer 116 facing away from the bottom transparent conductive layer 106.

Specifically, the first electrode layer 116 is formed on the surface of the bottom transparent conductive layer 106 facing away from the first doped layer 104 by a screen-printing process; the anti-reflection layer 118 is deposited on the first electrode layer 116 facing away from the bottom transparent conductive layer 106 by an electron beam evaporation process; and the anti-reflection layer 118 on a part of the surface of the first electrode layer 116 is removed to expose the first electrode layer 116.

Exemplarily, the preparation method of the stacked cell further includes: depositing the first carrier transport layer 302 on the top surface of the conductive connecting layer 200 by using a magnetron sputtering process; depositing the perovskite layer 304 on the surface of the first carrier transport layer 302 by using a spin-coating process; depositing the second carrier transport layer 306 on the surface of the perovskite layer 304 by using the spin-coating process; depositing the top transparent conductive layer 308 on the top surface of the second carrier transport layer 306 by using the magnetron sputtering process; and depositing the second electrode layer 310 on the surface of the top transparent conductive layer 308 by using a thermal evaporation device.

It should be understood that although the individual steps in the flow chart of FIG. 4 are shown sequentially as indicated by arrows, the steps are not necessarily performed sequentially in the order indicated by the arrows. Unless explicitly stated herein, the execution of these steps is not strictly limited in order and these steps can be performed in any other order. Moreover, at least some of the steps of FIG. 4 may include a plurality of sub-steps or a plurality of stages that are not necessarily performed at the same time, but may be performed at different times. The order in which these sub-steps or stages are performed is not necessarily sequential, and these steps may be performed alternately or alternately with other steps or at least some of the sub-steps or stages in other steps.

The technical features in the above embodiments may be combined arbitrarily. For concise description, not all possible combinations of the technical features in the above embodiments are described. However, provided that they do not conflict with each other, all combinations of the technical features are to be considered to be within the scope described in this specification.

The above-mentioned embodiments only describe several implementations of the embodiments of the present disclosure, and their description is specific and detailed, but should not be understood as a limitation on the patent scope of the present disclosure. It should be noted that, for a person of ordinary skill in the art may further make variations and improvements without departing from the conception of the present disclosure, and these all fall within the protection scope of the embodiments of the present disclosure.

What is claimed is:

1. A stacked cell comprising:
   a crystalline silicon cell;
   a conductive connecting layer located on a surface of the crystalline silicon cell;
   a first isolation layer extending from a surface of the conductive connecting layer facing away from the crystalline silicon cell to penetrate through the conductive connecting layer, the first isolation layer being made of an insulating material, and the first isolation layer being located inside the conductive connecting layer, and the first isolation layer being configured to reduce a transverse transport of carriers in the conductive connecting layer on both sides of the first isolation layer; and
   a perovskite cell located on the surface of the conductive connecting layer facing away from the crystalline silicon cell; and
   wherein the crystalline silicon cell comprises:
      a substrate having a first conductivity type;
      a first doped layer located on a side of the substrate facing away from the conductive connecting layer, the first doped layer having a second conductivity type;
      a bottom transparent conductive layer located on a surface of the first doped layer facing away from the substrate; and
      a second isolation layer extending from a surface of the bottom transparent conductive layer facing away from the first doped layer to penetrate through the bottom transparent conductive layer, the second isolation layer being made of an insulating material, and the second isolation layer being located inside the bottom transparent conductive layer.

2. The stacked cell according to claim 1, wherein a PN junction is formed between the substrate having the first conductivity type and the first doped layer having the second conductivity type.

3. The stacked cell according to claim 1, wherein majority carriers in the substrate having the first conductivity type are second carriers, and majority carriers in the first doped layer having the second conductivity type are first carriers; and the first carriers are holes and the second carriers are electrons.

4. The stacked cell according to claim 1, wherein a material of the conductive connecting layer comprises one of ITO, ICO, IWO, VTTO, IZO, and AZO; and the conductive connecting layer is made of a transparent material; and a thickness of the conductive connecting layer is in a range of 15 nm to 25 nm or in a range of 80 nm to 150 nm.

5. The stacked cell according to claim 1, wherein a material of the substrate comprises a monocrystalline silicon having the first conductivity type and a thickness of the substrate is in a range of 50 μm to 500 μm; a material of the first doped layer comprises a doped amorphous silicon having the second conductivity type; and/or a thickness of the bottom transparent conductive layer is 110 nm, and a material of the bottom transparent conductive layer comprises one of ITO, ICO, IWO, VTTO, IZO and AZO.

6. The stacked cell according to claim 1, wherein the conductive connecting layer comprises a main connecting layer and a peripheral connecting layer, and in a plane parallel to the crystalline silicon cell, the peripheral connecting layer at least partially surrounds the main connecting layer, and the first isolation layer is located in at least a partial region between the peripheral connecting layer and the main connecting layer.

7. The stacked cell according to claim 1, wherein the bottom transparent conductive layer comprises a main conductive layer and an auxiliary conductive layer, and in a plane parallel to the crystalline silicon cell, the auxiliary conductive layer at least partially surrounds the main conductive layer, and the second isolation layer is located in at least a partial region between the auxiliary conductive layer and the main conductive layer.

8. The stacked cell according to claim 7, wherein an orthographic projection of the first isolation layer on the bottom transparent conductive layer covers the second isolation layer.

9. The stacked cell according to claim 1, wherein the crystalline silicon cell further comprises:
   a first electrode layer located on a surface of the bottom transparent conductive layer facing away from the first doped layer; and
   an anti-reflection layer located on a part of a surface of the first electrode layer facing away from the bottom transparent conductive layer.

10. The stacked cell according to claim 9, wherein a material of the anti-reflection layer comprises MgF2, and/or a material of the first electrode layer comprises a metallic silver.

11. The stacked cell according to claim 1, wherein the crystalline silicon cell further comprises:

a first passivation layer located between the first doped layer and the substrate;

a second passivation layer located on a surface of the substrate facing away from the first doped layer; and a second doped layer located on a surface of the second passivation layer facing away from the substrate and in contact with the conductive connecting layer, and having the first conductivity type.

12. The stacked cell according to claim 11, wherein a material of the first passivation layer and/or a constituent material of the second passivation layer comprises an intrinsic amorphous silicon or a silicon dioxide, and a thickness of the first passivation layer and a thickness of the second passivation layer is in a range of 1 nm to 20 nm; and/or a material of the second doped layer comprises a doped amorphous silicon having the first conductivity type, and a thickness of the second doped layer is in a range of 1 nm to 100 nm.

13. The stacked cell according to claim 1, wherein the perovskite cell comprises a first carrier transport layer, a perovskite layer, a second carrier transport layer, a top transparent conductive layer, and a second electrode layer that are sequentially stacked on the surface of the conductive connecting layer facing away from the crystalline silicon cell.

14. The stacked cell according to claim 13, wherein a material of the first carrier transport layer comprises a nickel oxide; and a thickness of the first carrier transport layer is in a range of 15 nm to 50 nm;

a material of the second carrier transport layer comprises a tin oxide, an oxide layer or a zinc oxide, and a thickness of the second carrier transport layer is in a range of 10 nm to 200 nm;

a material of the perovskite layer comprises $Cs_{0.25}FA_{0.75}Pb(I_{0.8}Br_{0.2})_3$, and a thickness of the perovskite layer is in a range of 200 nm to 1 μm; and/or a material of the top transparent conductive layer comprises one of ITO, ICO, IWO, VTTO, IZO and AZO, and a thickness of the top transparent conductive layer is in a range of 80 nm to 150 nm.

15. A method of preparing the stacked cell of claim 1, the method comprising:

providing the crystalline silicon cell;

forming the conductive connecting layer on the surface of the crystalline silicon cell;

forming the first isolation layer in the conductive connecting layer, the first isolation layer extending from the surface of the conductive connecting layer facing away from the crystalline silicon cell to penetrate through the conductive connecting layer, the first isolation layer being located inside the conductive connecting layer, and the first isolation layer being configured to reduce the transverse transport of carriers in the conductive connecting layer on both sides of the first isolation layer; and forming the perovskite cell on the surface of the conductive connecting layer facing away from the crystalline silicon cell; and wherein providing the crystalline silicon cell comprises: providing the substrate having the first conductivity type;

forming the first doped layer having the second conductivity type on the side of the substrate facing away from the conductive connecting layer;

forming the bottom transparent conductive layer on the surface of the first doped layer facing away from the substrate; and forming the second isolation layer in the bottom transparent conductive layer, the second isolation layer extending from the surface of the bottom transparent conductive layer facing away from the first doped layer to penetrate through the bottom transparent conductive layer, and the second isolation layer being located inside the bottom transparent conductive layer.

16. The preparation method according to claim 15, wherein the conductive connecting layer comprises a main connecting layer and a peripheral connecting layer, and in a plane parallel to the crystalline silicon cell, the peripheral connecting layer at least partially surrounded the main connecting layer, and wherein forming the first isolation layer in the conductive connecting layer comprises:

forming, in the conductive connecting layer, a first annular groove penetrating through the conductive connecting layer, the first annular groove being located in at least a partial region between the main connecting layer and the peripheral connecting layer; and filling the first annular groove to form the first isolation layer.

17. The method according to claim 15, wherein the bottom transparent conductive layer comprises a main conductive layer and an auxiliary conductive layer, and in a plane parallel to the crystalline silicon cell, the auxiliary conductive layer at least partially surrounded the main conductive layer, and wherein forming the second isolation layer in the bottom transparent conductive layer comprises:

forming the second isolation layer in the bottom transparent conductive layer, the second isolation layer being located in at least a partial region between the auxiliary conductive layer and the main conductive layer.

18. The method according to claim 15, wherein providing the crystalline silicon cell further comprises:

forming a first electrode layer on the surface of the bottom transparent conductive layer facing away from the first doped layer; and forming an anti-reflection layer on a part of a surface of the first electrode layer facing away from the bottom transparent conductive layer.

19. The method according to claim 15, wherein before forming the first doped layer having the second conductivity type on the side of the substrate facing away from the conductive connecting layer, the method further comprises:

forming a first passivation layer on a surface of the substrate facing away from the conductive connecting layer;

forming a second passivation layer on a surface of the substrate close to the conductive connecting layer; and forming a second doped layer having the first conductivity type on a surface of the second passivation layer, the second doped layer being in contact with the conductive connecting layer.

20. The method according to claim 15, wherein after providing the substrate having the first conductivity type, the method further comprises:

preprocessing the substrate to obtain a preset substrate; and wherein the preset substrate comprises one of a double-sided polished substrate, a double-sided textured substrate, and a single-sided polished and single-sided textured substrate.

* * * * *